US012448688B2

(12) United States Patent
Kinoshita et al.

(10) Patent No.: US 12,448,688 B2
(45) Date of Patent: Oct. 21, 2025

(54) FILM FORMING METHOD AND APPARATUS

(71) Applicant: Kioxia Corporation, Tokyo (JP)

(72) Inventors: Shigeru Kinoshita, Yokkaichi Mie (JP); Hiroshi Toyoda, Yokkaichi Mie (JP); Satoshi Wakatsuki, Yokkaichi Mie (JP); Masayuki Kitamura, Yokkaichi Mie (JP); Naomi Fukumaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 281 days.

(21) Appl. No.: 17/943,695

(22) Filed: Sep. 13, 2022

(65) Prior Publication Data

US 2023/0295801 A1 Sep. 21, 2023

(30) Foreign Application Priority Data

Mar. 15, 2022 (JP) ................................ 2022-040566

(51) Int. Cl.

*C23C 16/455* (2006.01)
*C23C 16/34* (2006.01)
*C23C 16/40* (2006.01)
*C23C 16/44* (2006.01)

(52) U.S. Cl.

CPC ........ *C23C 16/45529* (2013.01); *C23C 16/34* (2013.01); *C23C 16/403* (2013.01); *C23C 16/4408* (2013.01); *C23C 16/4412* (2013.01); *C23C 16/45544* (2013.01)

(58) Field of Classification Search

None

See application file for complete search history.

(56) References Cited

U.S. PATENT DOCUMENTS

| | | | | |
|---|---|---|---|---|
| 8,772,077 | B2 | 7/2014 | Lee et al. | |
| 9,536,745 | B2 | 1/2017 | Narushima et al. | |
| 10,870,919 | B2 | 12/2020 | Yamaguchi et al. | |
| 2008/0026148 | A1* | 1/2008 | Tominaga ......... | C23C 16/45527 427/255.28 |
| 2009/0246373 | A1 | 10/2009 | Tachibana et al. | |
| 2012/0161218 | A1 | 6/2012 | Niitsuma et al. | |
| 2015/0111378 | A1 | 4/2015 | Ogawa et al. | |
| 2017/0306479 | A1* | 10/2017 | Raisanen .......... | C23C 16/45525 |

(Continued)

FOREIGN PATENT DOCUMENTS

| | | | |
|---|---|---|---|
| JP | 2012-151435 | A | 8/2012 |
| JP | 5373056 | B2 | 12/2013 |

(Continued)

*Primary Examiner* — Mandy C Louie

(74) *Attorney, Agent, or Firm* — Foley & Lardner LLP

(57) ABSTRACT

According to one embodiment, a film forming method includes alternately performing a first process including at least two times of a first sequence and a second process including at least one time of a second sequence. The first sequence includes supplying a film forming gas into a film forming chamber, supplying a first purge gas into the film forming chamber, supplying a first reduction gas into the film forming chamber, and supplying a second purge gas into the film forming chamber, in order, and the second sequence includes supplying a second reduction gas into the film forming chamber, and supplying a third purge gas into the film forming chamber, in order.

10 Claims, 12 Drawing Sheets

(56) References Cited

U.S. PATENT DOCUMENTS

| | | | |
|---|---|---|---|
| 2019/0164768 | A1 | 5/2019 | Narushima et al. |
| 2021/0238736 | A1* | 8/2021 | Butail ..................... C23C 16/14 |
| 2021/0317568 | A1* | 10/2021 | Du ...................... C23C 14/5846 |

FOREIGN PATENT DOCUMENTS

| | | | |
|---|---|---|---|
| JP | 2015-109419 | A | 6/2015 |
| JP | 2019-099835 | A | 6/2019 |
| JP | 6706903 | B2 | 6/2020 |
| JP | 6877188 | B2 | 5/2021 |
| JP | 2021-523292 | A | 9/2021 |
| KR | 10-2020-0145001 | A | 12/2020 |
| WO | WO-2007/018003 | A1 | 2/2007 |
| WO | WO-2019/213604 | A1 | 11/2019 |
| WO | WO-2020/188632 | A1 | 9/2020 |

* cited by examiner

FILM FORMING METHOD AND APPARATUS

CROSS-REFERENCE TO RELATED APPLICATIONS

This application is based upon and claims the benefit of priority from Japanese Patent Application No. 2022-040566, filed Mar. 15, 2022, the entire contents of which are incorporated herein by reference.

FIELD

Embodiments described herein relate generally to a film forming method and a film forming apparatus.

BACKGROUND

When film formation is performed by atomic layer deposition (ALD) or the like, it is desirable to accurately perform the film forming process.

DETAILED DESCRIPTION

In general, according to one embodiment, a film forming method includes alternately performing a first process including at least two times of a first sequence and a second process including at least one time of a second sequence, wherein the first sequence includes supplying a film forming gas into a film forming chamber in which a film formation object is set, supplying a first purge gas into the film forming chamber in which the film formation object is set, supplying a first reduction gas into the film forming chamber in which the film formation object is set, and supplying a second purge gas into the film forming chamber in which the film formation object is set, in order, and the second sequence includes supplying a second reduction gas into the film forming chamber in which the film formation object is set, and supplying a third purge gas into the film forming chamber in which the film formation object is set, in order.

Embodiments will be described hereinafter with reference to the accompanying drawings.

Figure 1:
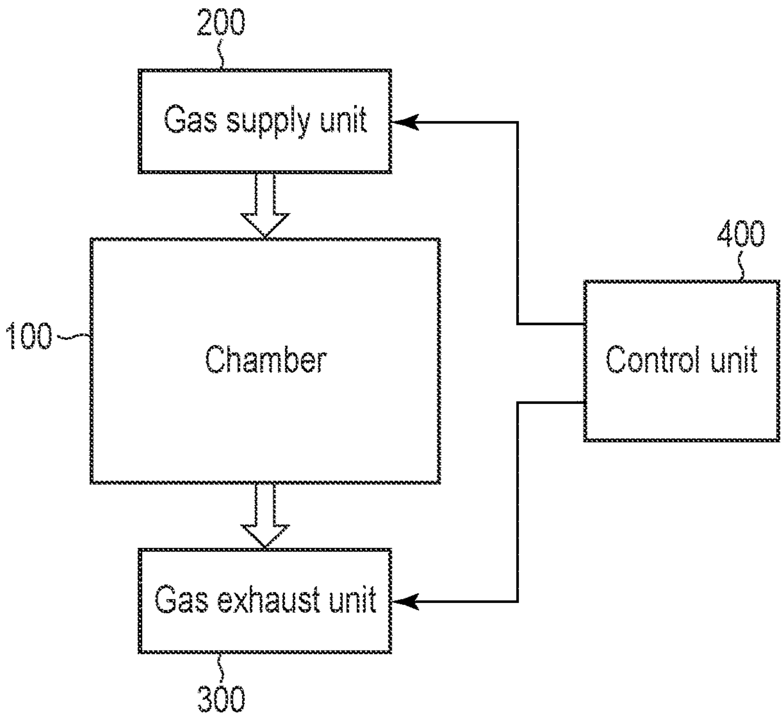
FIG. 1 is a block diagram showing a basic configuration of a film forming apparatus according to embodiments.

FIG. 1 is a block diagram showing a basic configuration of a film forming apparatus according to embodiments.

The film forming apparatus shown in FIG. 1 is a film forming apparatus using atomic layer deposition (ALD) and includes a chamber (film forming chamber) 100, a gas supply unit 200, a gas exhaust unit 300, and a control unit 400.

A film formation object (not shown) is set in the chamber 100, such that the film formation object is subjected to the film formation by ALD. The gas supply unit 200 is connected to the chamber 100, and film forming gas (source gas), reduction gas, and purge gas are supplied into the chamber 100 by the gas supply unit 20. In addition, the gas exhaust unit 300 is connected to the chamber 100, such that the gas inside the chamber 100 is exhausted by the gas exhaust unit 300. The operations of the gas supply unit 200 and the gas exhaust unit 300 are controlled by the control unit 400. The control operations performed by the control unit 400 will be described later in detail.

Figure 2:
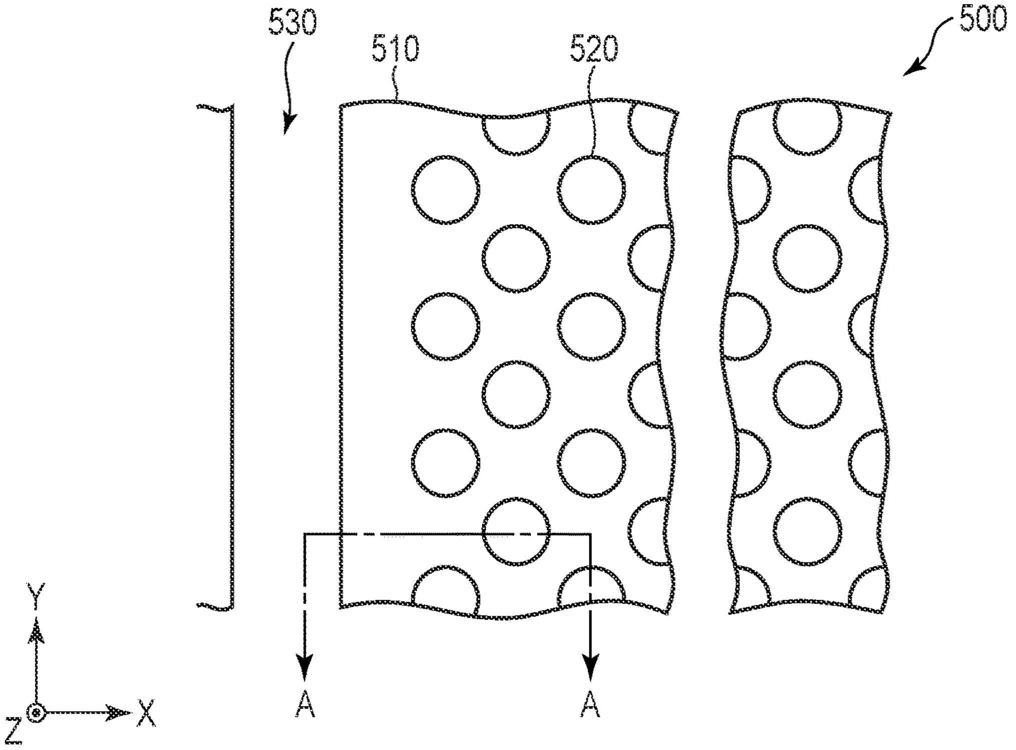
FIG. 2 is a planar pattern view schematically showing a configuration of a film formation object set in a chamber, according to the embodiments.
Figure 3:
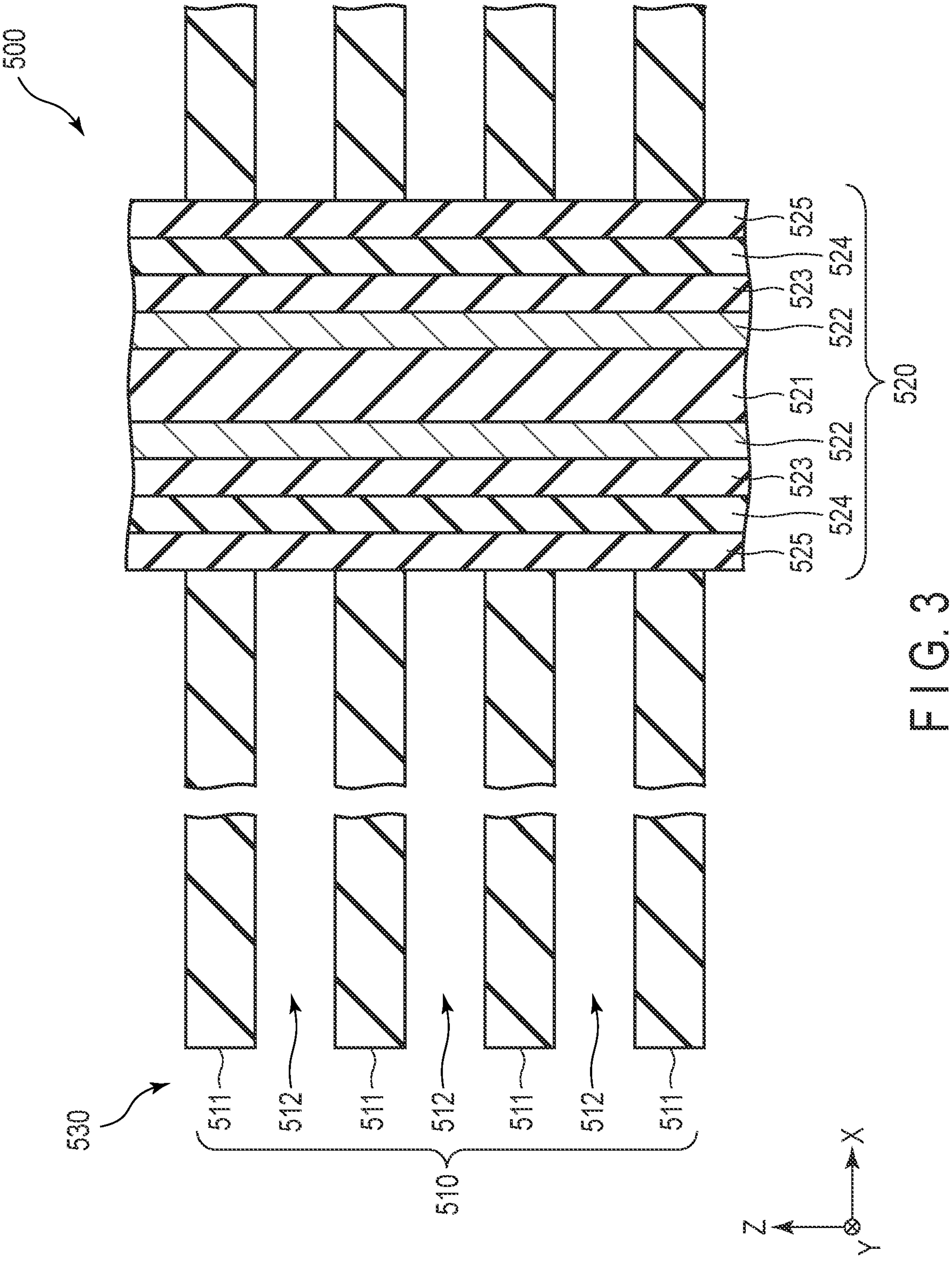
FIG. 3 is a cross-sectional view schematically showing the configuration of the film formation object set in the chamber, according to the embodiments.

FIG. 2 is a planar pattern view schematically showing a configuration of a film formation object 500 set in the chamber 100. FIG. 3 is a cross-sectional view schematically showing the configuration of the film formation object 500 set in the chamber 100. A cross section taken along line A-A in FIG. 2 corresponds to FIG. 3. The film formation object 500 is used to form a NAND flash memory having a three-dimensional structure.

As shown in FIG. 2 and FIG. 3, the film formation object 500 includes a stacked structure 51, and a pillar structure 520 extending in the Z direction inside the stacked structure 510. In addition, a slit 530 extending in the Y and Z directions inside the stacked structure 510 is provided in the film formation object 500. The X direction, Y direction, and Z direction are directions intersecting each other. More specifically, the X direction, the Y direction, and the Z direction are directions orthogonal to each other.

The stacked structure 510 has a structure in which a plurality of insulating layers 511 and a plurality of spaces 512 are alternately arranged in the Z direction.

The pillar structure 520 includes a core insulating layer 521, a semiconductor layer 522 surrounding a side surface of the core insulating layer 521, a tunnel insulating layer 523 surrounding a side surface of the semiconductor layer 522, a charge storage layer 524 surrounding a side surface of the tunnel insulation layer 523, and a block insulating layer 525 surrounding a side surface of the charge storage layer 524.

Figure 4:
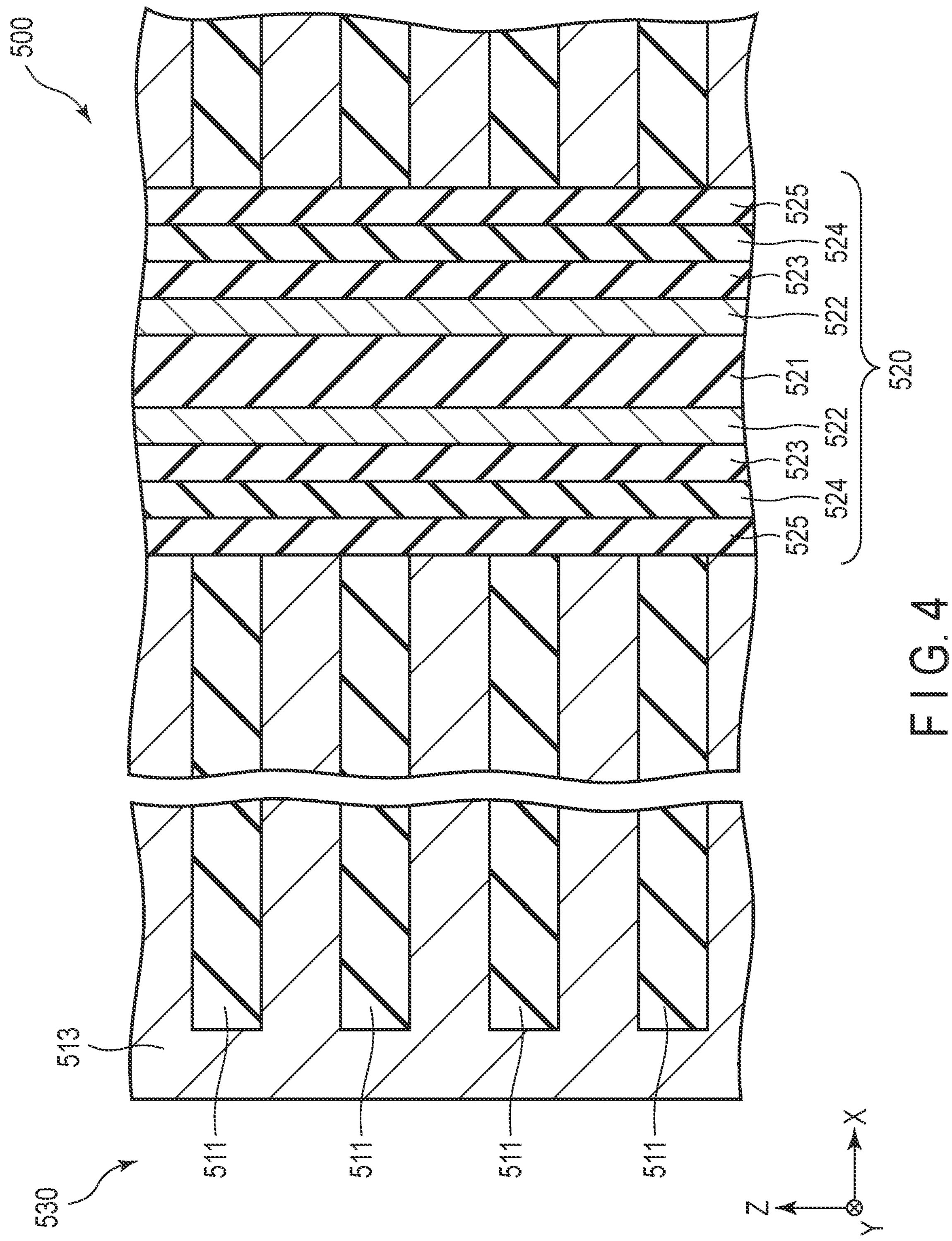
FIG. 4 is a cross-sectional view schematically showing the structure in which the film formation has been performed for the film formation object, according to the embodiments.

FIG. 4 is a cross-sectional view schematically showing the structure in which the film formation has been performed for the film formation object 500 by the film forming apparatus shown in FIG. 1.

A conductive material is used as the film forming material, and a conductive layer 513 is formed in an area including a space 512 shown in FIG. 3. More specifically, the conductive layer 513 is formed in the area including the space 512 by supplying gas through the slit 530.

Figure 5:
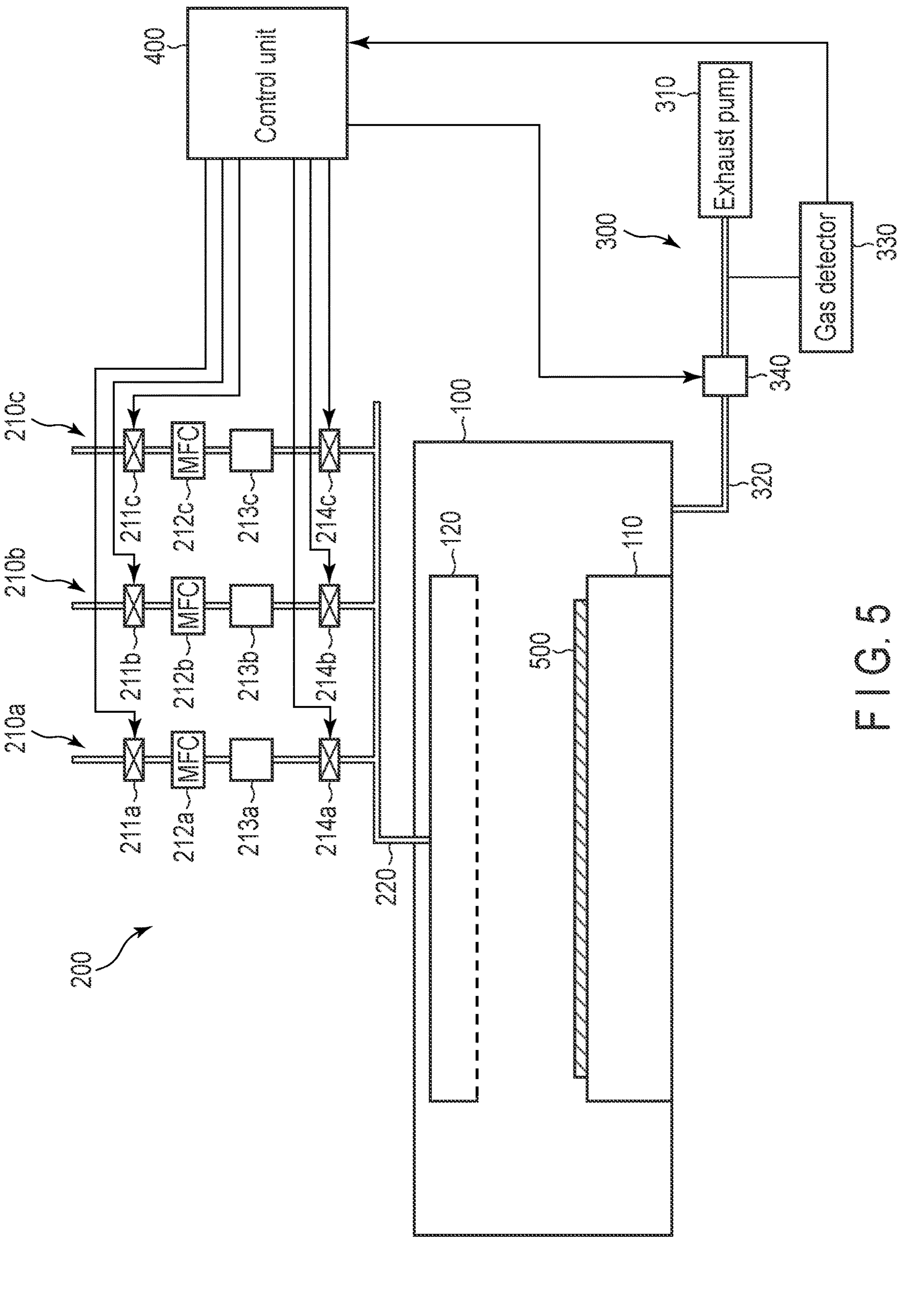
FIG. 5 is a view schematically showing a detailed structure of a film forming apparatus according to the embodiments.

FIG. 5 is a view schematically showing a detailed structure of the film forming apparatus shown in FIG. 1.

A table 110 equipped with a heater is provided in the chamber 100, and the film formation object 500 is set on the table 110. A shower head 120 is provided above the table 110, and film forming gas, reduction gas, and purge gas are supplied from the shower head 120 into the chamber 100.

The gas supply unit 200 is connected to the chamber 100. The gas supply unit 200 includes a film forming gas (source gas) supply system 210*a*, a reduction gas supply system 210*b*, a purge gas supply system 210*c*, and a gas supply pipe 220. Gases are supplied from the gas supply systems 210*a*, 210*b*, and 210*c* to the shower head 120 through the gas supply pipe 220.

The film forming gas (source gas) supply system 210*a* includes a valve 211*a*, a mass flow controller 212*a*, a gas tank 213*a*, and a valve 214*a*. Similarly, the reduction gas supply system 210*b* includes a valve 211*b*, a mass flow controller 212*b*, a gas tank 213*b*, and a valve 214*b*, and the purge gas supply system 210*c* includes a valve 211*c*, a mass flow controller 212*c*, a gas tank 213*c* and a valve 214*c*.

In addition, the gas exhaust unit 300 is connected to the chamber 100. The gas exhaust unit 300 includes an exhaust pump 310, an exhaust pipe 320, a gas detector 330, and a pressure regulator valve 340.

The control unit 400 is connected to the gas supply unit 200 and the gas exhaust unit 300, and a gas supply operation of the gas supply unit 200 and a gas exhaust operation of the gas exhaust unit 300 are controlled by the control unit 400.

Next, a film forming method performed using the above-described film forming apparatus will be described. As already mentioned, film formation is performed by ALD in the embodiments.

Figure 6:
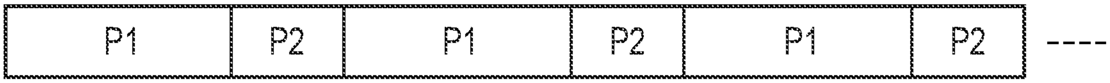
FIG. 6 is a view showing a basic operation of a film forming method according to the embodiments.

FIG. 6 is a view showing a basic operation of the film forming method according to the embodiments. As shown in FIG. 6, a first process P1 and a second process P2 are alternately performed in the film forming method according to the embodiments.

Figure 7:
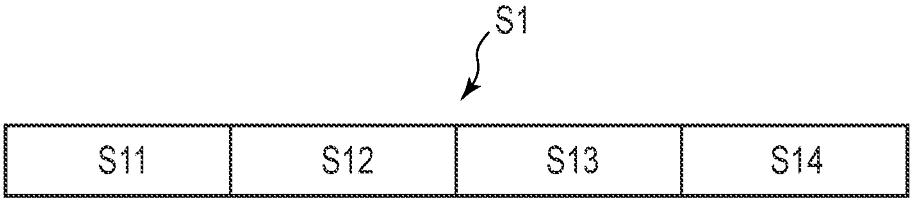
FIG. 7 is a view showing a first sequence in the film forming method according to the embodiments.

FIG. 7 shows a first sequence S1 included in the first process P1.

The first sequence S1 includes a step S11 of supplying a film forming gas into the chamber (film forming chamber) 100, a step S12 of supplying purge gas into the chamber 100, a step S13 of supplying reduction gas into the chamber 100, and a step S14 of supplying purge gas into chamber 100. The first sequence S1 is performed in order of step S11, step S12, step S13, and step S14.

Figure 8:
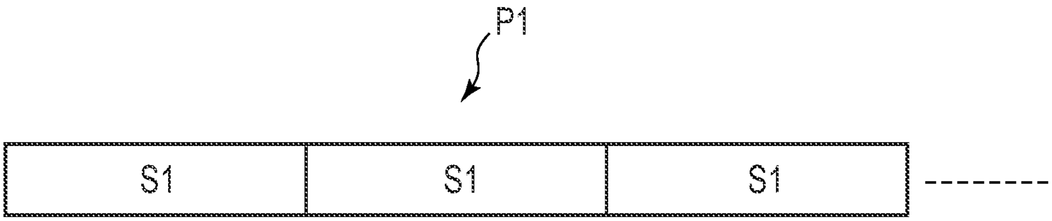
FIG. 8 is a view showing a first process in the film forming method according to the embodiments.

As shown in FIG. 8, in the first process P1, the first sequence S1 described above is performed at least twice. In other words, steps S11, S12, S13, and S14 are repeated in a manner such as S11, S12, S13, S14, S11, S12, S13, S14.

In step S11, the film forming gas (source gas) is supplied from the film forming gas (source gas) supply system 210*a* shown in FIG. 5 into the chamber 100 through the gas supply pipe 220 and the shower head 120. More specifically, the film forming gas is supplied into the chamber 100 by controlling the valve 214*a* to be opened by the control unit 400 (normally, the valve 211*a* is opened at any time). The film forming gas contains metallic element. More specifically, $WF_6$ gas containing tungsten (W) and fluorine (F) is used as the film forming gas. The film forming gas may further contain argon (Ar) gas as a carrier gas.

In step S12, the purge gas is supplied from the purge gas supply system 210*c* into the chamber 100 through the gas supply pipe 220 and the shower head 120. More specifically, the purge gas is supplied into the chamber 100 by controlling the valve 214*c* to be opened by the control unit 400 (normally, the valve 211*c* is opened at any time). Argon (Ar) gas is used as the purge gas. The film forming gas is purged by supplying the purge gas.

In step S13, the reduction gas is supplied from the reduction gas supply system 210*b* into the chamber 100 through the gas supply pipe 220 and the shower head 120. More specifically, the reduction gas is supplied into the chamber 100 by controlling the valve 214*b* to be opened by the control unit 400 (normally, the valve 211*b* is opened at any time). Hydrogen gas ($H_2$ gas) is used as the reduction gas. The reduction gas may further contain argon (Ar) gas as a carrier gas.

In step S14, the purge gas is supplied from the purge gas supply system 210*c* into the chamber 100 through the gas supply pipe 220 and the shower head 120. More specifically, the purge gas is supplied into the chamber 100 by controlling the valve 214*c* to be opened by the control unit 400 (normally, the valve 211*c* is opened at any time). Argon (Ar) gas is used as the purge gas, similarly to step S12. The reduction gas is purged by supplying the purge gas. In addition, a byproduct (HF) produced by the reaction between the film forming gas ($WF_6$ gas) and the reduction gas ($H_2$ gas) is also purged by the purge gas.

Figure 9:
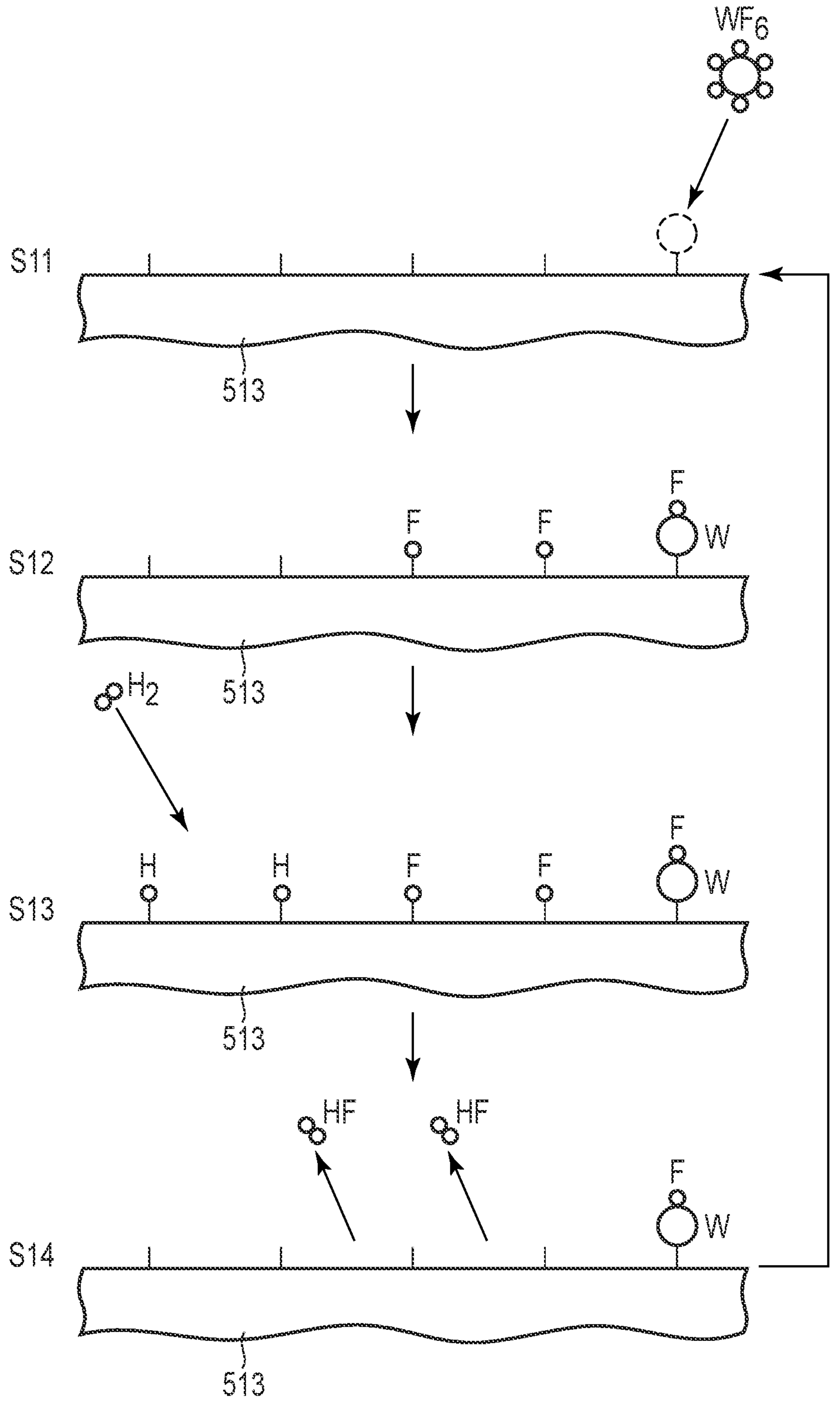
FIG. 9 is a view schematically showing operations performed in the first sequence in the film forming method according to the embodiments.

FIG. 9 is a view schematically showing the operations performed in steps S11, S12, S13, and S14 of the first sequence S1 described above. FIG. 9 shows a state in which the conductive layer (W layer) 513 is formed to some extent.

In step S11, the film forming gas ($WF_6$ gas) is supplied to the surface of the conductive layer 513. In step S12, the $WF_6$ gas that is not adsorbed on the conductive layer 513 is purged. In step S13, the reduction gas ($H_2$ gas) is supplied to the surface of the conductive layer 513. In step S14, hydrogen (H) and fluorine (F) combine to produce HF, and the produced HF is purged. These steps S11 to S14 are repeated, and tungsten (W) is adsorbed on the surface of the conductive layer 513 to form an atomic layer of tungsten (W).

The number of times of the first sequence S1 included in each first process P1 is desirably smaller than twice the number of times of the first sequence S1 required to form one atomic layer on the surface of the conductive layer 513 (surface of a film formation object). By thus setting the number of times of the first sequence S1, an atomic layer of tungsten (W) can be accurately formed for each atomic layer.

Figure 10A:
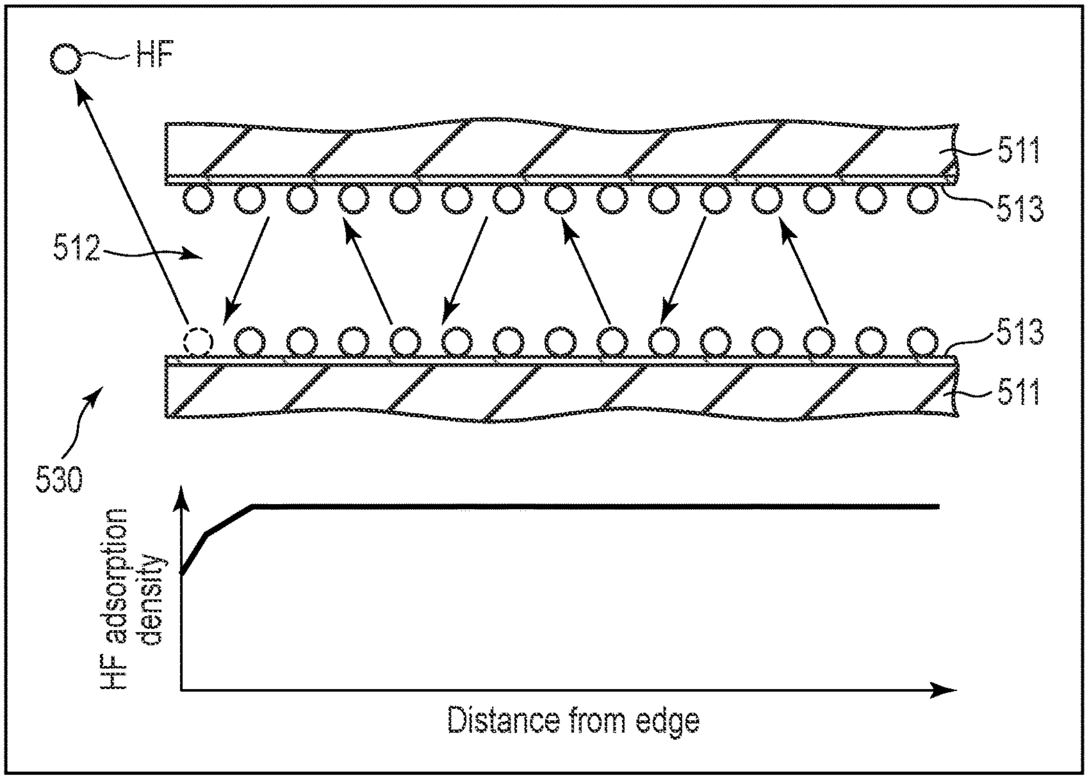
FIG. 10A is a view schematically showing operations performed in a purge gas supply step in the film forming method according to the embodiments.
Figure 10B:
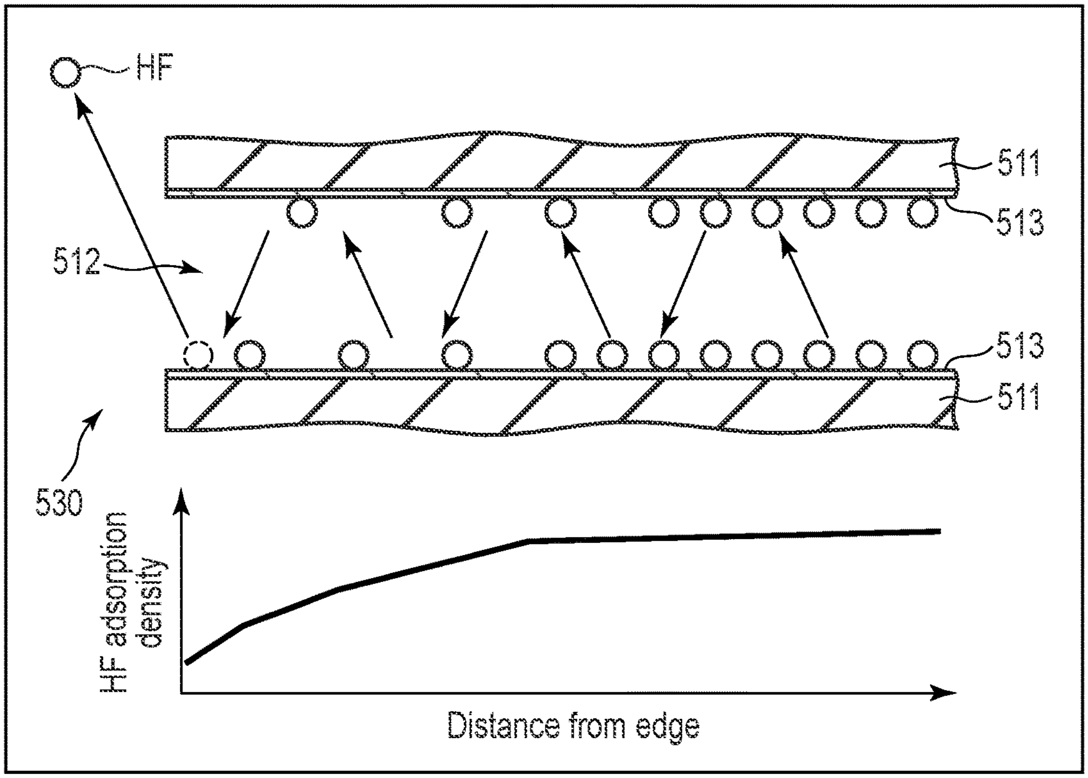
FIG. 10B is a view schematically showing operations performed in a purge gas supply step in the film forming method according to the embodiments.

FIG. 10A and FIG. 10B are views schematically showing a state in which HF produced by the reduction reaction is purged in purge gas supply step S14 described above. FIG. 10A shows an initial state of purge gas supply step S14, and FIG. 10B shows a middle state of purge gas supply step S14.

In FIG. 10A and FIG. 10B, HF is indicated by circles. Originally, when HF is adsorbed, H and F are separately adsorbed at the surface site as shown in step S13 of FIG. 9, but adsorbed H and F are released again as HF by the reduction reaction. For this reason, the adsorption state in which HF molecules are adsorbed is schematically shown.

As shown in FIG. 10A, the adsorption density of HF decreases only near the edge of the conductive layer 513 on the slit 530 side, in an initial stage of purge gas supply step S14. As shown in FIG. 10B, the adsorption density of HF decreases even at a position far from the edge of the conductive layer 513 on the slit 530 side, in a middle stage of purge gas supply step S14. It can be therefore recognized that as purge gas supply step S14 progresses the HF in a deeper position of the space 512 is also exhausted.

Figure 11:
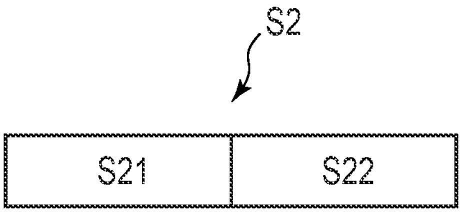
FIG. 11 is a view showing a second sequence in the film forming method according to the embodiments.

FIG. 11 is a view showing the second sequence S2 included in the second process P2.

The second sequence S2 includes step S21 of supplying the reduction gas into the chamber 100 and step S22 of supplying the purge gas into the chamber 100. The second sequence S2 is performed in order of step S21 and step S22.

Figure 12:
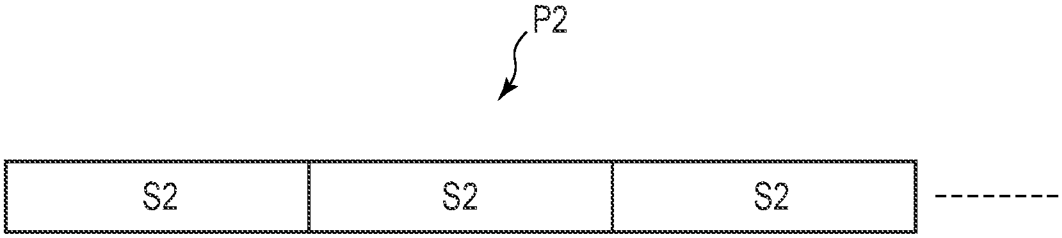
FIG. 12 is a view showing the second process in the film forming method according to the embodiments.

In the second process P2, the second sequence S2 described above is performed at least once. In other words, the second sequence S2 may be performed only once or the second sequence S2 may be repeated two or more times as shown in FIG. 12.

In step S21, the reduction gas is supplied from the reduction gas supply system 210*b* into the chamber 100 through the gas supply pipe 220 and the shower head 120. More specifically, the reduction gas is supplied into the chamber 100 by controlling the valve 214*b* to be opened by the control unit 400. Hydrogen gas ($H_2$ gas) is used as the reduction gas, similarly to the reduction gas in step S13. The reduction gas may further contain argon (Ar) gas as a carrier gas.

In step S22, the purge gas is supplied from the purge gas supply system 210*c* into the chamber 100 through the gas supply pipe 220 and the shower head 120. More specifically, the purge gas is supplied into the chamber 100 by controlling the valve 214*c* to be opened by the control unit 400. Argon (Ar) gas is used as the purge gas, similarly to steps S12 and S14. Similarly to step S14, the reduction gas and the byproduct (HF) are purged by supplying the purge gas.

As can be understood from the above, reduction gas supply step S21 and purge gas supply step S22 performed in the second process P2 are basically the same as reduction gas supply step S13 and purge gas supply step S14 performed in the first process P1. In other words, steps S13 and S14 are performed in the first process P1 and then steps S21 and S 22 are continuously performed in the second process P2.

By alternately performing the first process P1 and the second process P2 described above, the number of atomic layers of tungsten (W) gradually increases, and the conductive layer 513 as shown in FIG. 4 is formed. For example, by performing the second process P2 every time the W layer of one atomic layer is formed in the first process P1, the number of atomic layers of tungsten (W) gradually increases while sufficiently exhausting HF.

As described above, in the embodiments, the first process P1 and the second process P2 are alternately performed. The first process P1 includes at least two times of the first sequence S1, and the second process P2 includes at least one time of the second sequence S2. According to this method, it is possible to accurately perform the film forming process and to accurately form the conductive layer 513, as described below.

As already described, when the film formation is performed by ALD, the byproduct caused by the film forming gas and the reduction gas is likely to be adsorbed on the surface of the film formation object. As a result, the accurate film forming process is likely to be inhibited and the characteristics and reliability of the elements are likely to be affected. In particular, as described in the above embodiments, when the conductive layer is formed in a narrow space, it is difficult to efficiently exhaust the byproduct in the space. In addition, when the pillar structure 520 is arranged as shown in FIG. 2, it is even more difficult to efficiently exhaust the byproduct in the space. In the above-described embodiments, HF produced by $WF_6$ gas (film forming gas) and $H_2$ gas (reduction gas) remains in the space as the byproduct, which may affect the characteristics and reliability of the semiconductor device.

For example, when the first sequence S1 (film forming gas supply step S11, purge gas supply step S12, reduction gas supply step S13, and purge gas supply step S14) described above in the embodiments is only repeated, the reduction gas supply step S13 and purge gas supply step S14 are not necessarily performed sufficiently, and a large amount of HF is likely to remain in the space as the byproduct.

In order to solve the above-mentioned problem, performing the first sequence S1 and then the second sequence S2 (reduction gas supply step S21 and purge gas supply step S22) described above in the embodiments is considered effective. However, if the second sequence S2 is performed every time the first sequence S1 is performed, the number of times of the second sequence S2 is relatively increased and the time spent for the entire film forming process becomes longer.

In the embodiments, the first sequence S1 is performed two or more times in the first process P1, and then the second sequence S2 is performed one or more times in the second process P2. For this reason, the byproduct (HF) in the space can be exhausted efficiently and the increase in time spent for the entire film forming process can be suppressed. Therefore, in the embodiments, the conductive layer 513 can be formed by an accurate film forming process, and the characteristics and reliability of the semiconductor device can be improved.

In the embodiments, the number of times of the first sequence S1 in the first process P1 may be constant, but the number of times of the first sequence S1 in the first process P1 may be varied as described later. Similarly, the number of times of the second sequence S2 in the second process P2 may be constant, but the number of times of the second sequence S2 in the second process P2 may be varied as described later.

Next, a first modified example of the embodiments will be described.

Figure 13A:
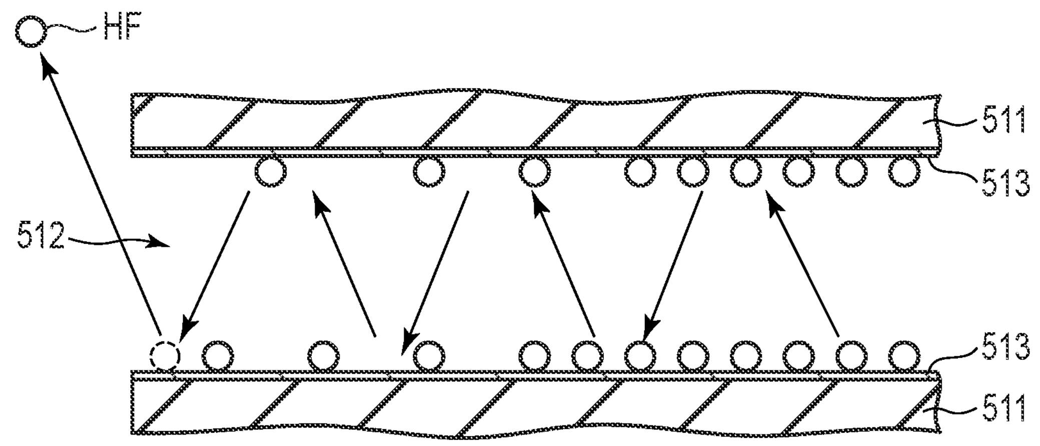
FIG. 13A is a view schematically showing a state when forming a conductive layer in a space in the film forming method according to the embodiments.
Figure 13B:
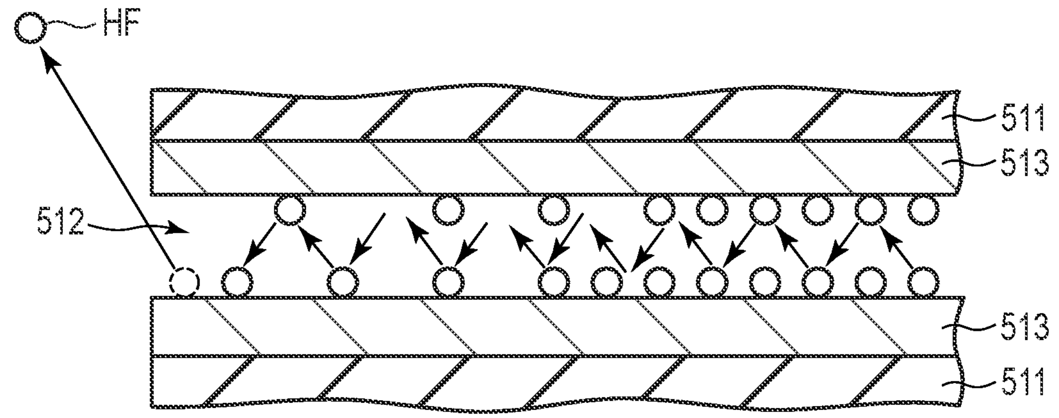
FIG. 13B is a view schematically showing a state when forming a conductive layer in a space in the film forming method according to the embodiments.

FIG. 13A and FIG. 13B are views schematically showing a state in which the conductive layer 513 is to be formed in the space 512. FIG. 13A shows a state of an initial stage of film formation, and FIG. 13B shows a state of a middle stage of film formation.

As shown in FIG. 13A, the conductive layer 513 is hardly formed and the space 512 is relatively wide, in the initial stage of film formation. For this reason, the byproduct (HF) can be exhausted relatively easily. In contrast, as shown in FIG. 13B, the thickness of the conductive layer 513 increases and the space 512 becomes narrower, in the middle stage of film formation. For this reason, the byproduct (HF) becomes hardly exhausted.

In the modified example, based on the exhaust characteristics as described above, control is performed such that the number of times of the second sequence S2 in the second process P2 increases as the film formation proceeds, i.e., as the thickness of the conductive layer 513 increases.

Generally speaking, control is performed such that when "p" refers to a desired positive integer larger than or equal to 1 and when "a" refers to a desired positive integer larger than or equal to 1, the number of times of the second sequence S2 in the (p+a)-th second process P2 is larger than the number of times of the second sequence S2 in the p-th second process P2.

Figure 14:
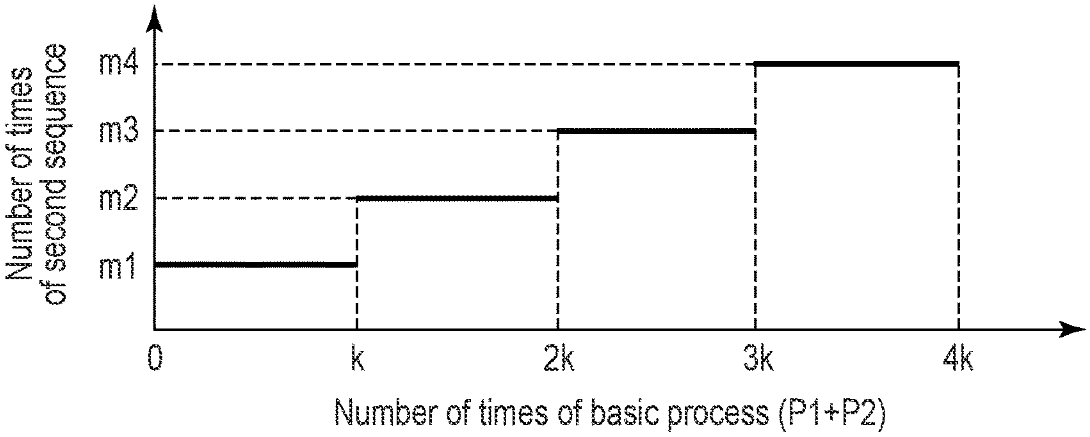
FIG. 14 is a graph showing a first specific example of a first modified example of the film forming method according to the embodiments.

FIG. 14 is a graph showing a first specific example of the modified example. The horizontal axis indicates the number of times of the basic process (first process P1+second process P2), and the vertical axis indicates the number of times of the second sequence S2 in the second process P2.

As shown in FIG. 14, in the specific example, the number of times of the second sequence S2 in the second process P2 increases as the number of times of the basic process increases, i.e., as the thickness of the conductive layer 513 increases. More specifically, each time the basic process is performed a certain number of times (k times), the number of times of the second sequence S2 increases to m1, m2, m3, and m4. Values m2−m1, m3−m2, and m4−m3 may be equal or different.

Figure 15:
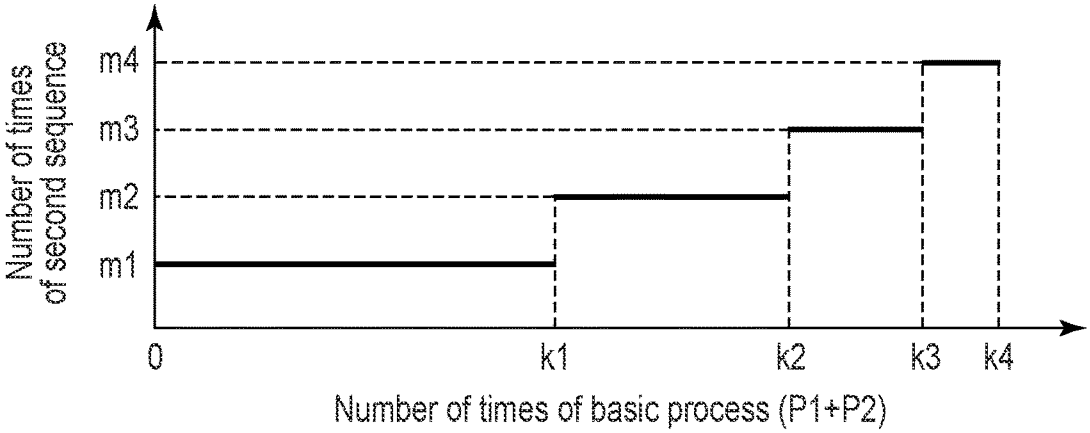
FIG. 15 is a graph showing a second specific example of the first modified example of the film forming method according to the embodiments.

FIG. 15 is a graph showing a second specific example of the modified example. The horizontal axis indicates the number of times of the basic process (first process P1+second process P2), and the vertical axis indicates the number of times of the second sequence S2 in the second process P2.

As shown in FIG. 15, in this specific example, too, the number of times of the second sequence S2 in the second process P2 increases as the number of times of the basic process increases. More specifically, the period until the number of times of the second sequence S2 increases becomes shorter as the number of times of the basic process increases. In other words, k1>(k2−k1)>(k3−k2)>(k4−k3).

As described above, the modified example is also the same as the above-described embodiment in basic control method, and the same advantages as those of the above-described embodiment can be obtained. In addition, in the modified example, the byproduct in the space can be exhausted more effectively and the increase in time spent on the entire film forming process can be suppressed more effectively, according to the above-described control method.

Next, a second modified example of the embodiments will be described.

As already described with reference to FIG. 13A and FIG. 13B, the space 512 is relatively wide, in the initial stage of film formation, and the space 512 becomes narrower as the film formation proceeds. For this reason, the byproduct (HF) becomes hardly exhausted as the film formation proceeds. From another viewpoint, it is considered that in the initial stage of film formation, even if the number of times of the first sequence in the first process P1 is relatively large, the byproduct (HF) can be exhausted relatively easily.

Therefore, in this modified example, control is performed such that the number of times of the first sequence in the first process P1 is relatively decreased as the film formation proceeds.

Generally speaking, control is performed such that when "q" refers to a desired positive integer larger than or equal to 1 and when "b" refers to a desired positive integer larger than or equal to 1, the number of times of the first sequence S1 in the (q+b)-th first process P1 is smaller than the number of times of the first sequence S1 in the q-th first process P1.

Figure 16:
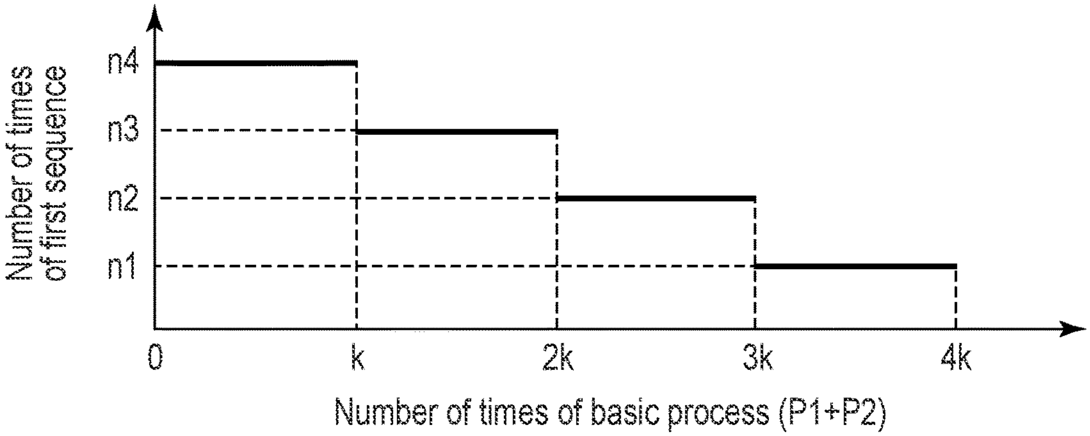
FIG. 16 is a graph showing a specific example of the second modified example of the film forming method according to the embodiments.

FIG. 16 is a graph showing a specific example of the modified example. The horizontal axis indicates the number of times of the basic process (first process P1+second process P2), and the vertical axis indicates the number of times of the first sequence S1 in the first process P1.

As shown in FIG. 16, in the specific example, the number of times of the first sequence S1 in the first process P1 decreases as the number of times of the basic process increases, i.e., as the thickness of the conductive layer 513 increases. More specifically, each time the basic process is performed a certain number of times (k times), the number of times of the first sequence S1 decreases to n4, n3, n2, and n1. Values n2−n1, n3−n2, and n4−n3 may be equal or different.

As described above, the modified example is also the same as the above-described embodiment in basic control method, and the same advantages as those of the above-described embodiment can be obtained. In addition, in the modified example, the byproduct in the space can be exhausted more effectively and the increase in time spent on the entire film forming process can be suppressed more effectively, according to the above-described control method.

Each of the number of times of the first sequence S1 in the first process P1 and the number of times of the second sequence S2 in the second process P2 may be varied, by combining the first and second modified examples described above.

Next, a third modified example of the embodiments will be described.

As shown in FIG. 5, the film forming gas, the reduction gas, and the purge gas are supplied into the chamber 100 through the gas tank 213*a*, the gas tank 213*b*, and the gas tank 213*c*, respectively. In this modified example, control is performed such that the film forming gas is not supplied to the gas tank 213*a* at least during the period when the second process P2 is being performed. In other words, the film forming gas is prevented from being supplied to the gas tank 213*a* by controlling the valve 211*a*.

Figure 17:
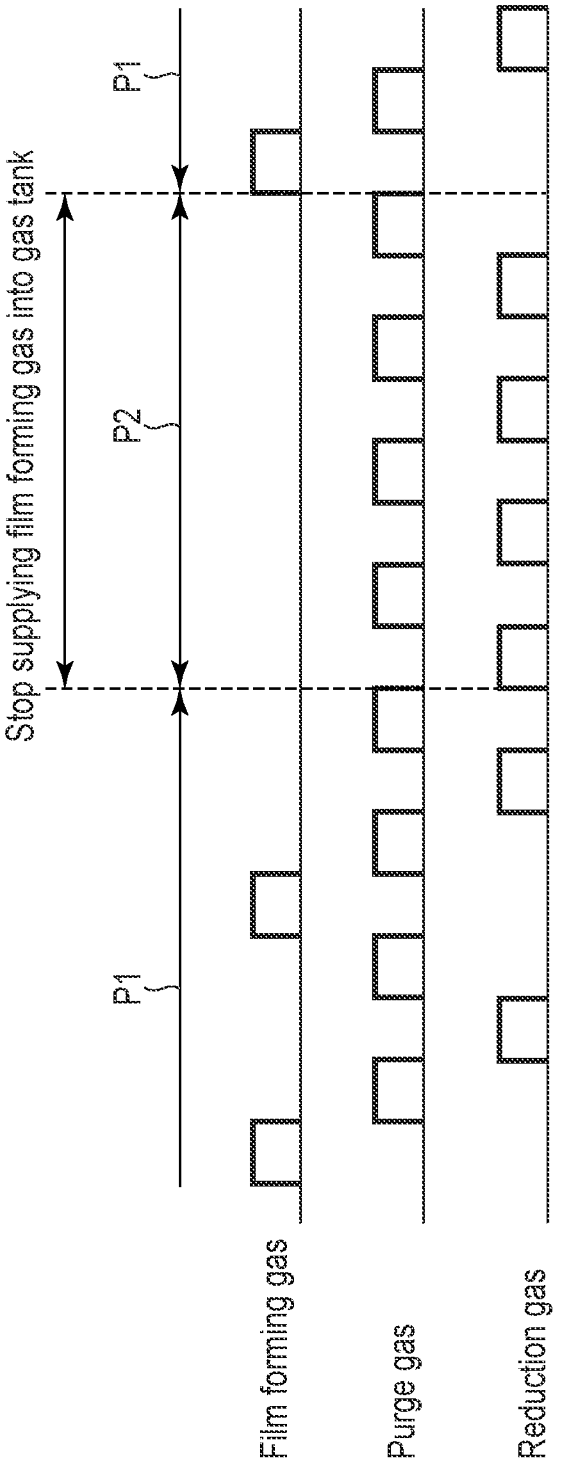
FIG. 17 is a timing chart showing an operation of a third modified example of the film forming method according to the embodiments.

FIG. 17 is a timing chart showing a gas supply operation (operation of gas supply to the chamber 100) in the modified example.

As shown in FIG. 17, after the last film forming gas is supplied into the chamber 100 in the first process, no film forming gas is supplied into the chamber 100 until the next first process is started. Therefore, the valve 211*a* is kept closed by the control unit 400 such that no film forming gas is supplied to the gas tank 213*a*, during the period of the second process P2 when no film forming gas is supplied into the chamber 100.

The modified example is also the same as the embodiments in basic control method, and the same advantages as those of the above-described embodiments can be obtained. In addition, in this modified example, it is possible to prevent the film forming gas from being continuously supplied into the gas tank 213*a* and prevent the pressure in the gas tank 213*a* from becoming too high during the period of the second process, by performing the above-described control.

Next, a fourth modified example of the embodiments will be described.

As shown in FIG. 5, the gas exhaust unit 300 includes the exhaust pump 310, the exhaust pipe 320, and the gas detector 330, and the gas detector 330 is connected to the exhaust pipe 320. The gas detector 330 can detect the amount of the byproduct (HF). In this modified example, the first process P1 and the second process P2 are controlled based on the result of detection of the byproduct (HF) in the gas detector 330. In other words, in this modified example, the first process P1 and the second process P2 are controlled based on the amount of the byproduct produced in the chamber 100.

Figure 18:
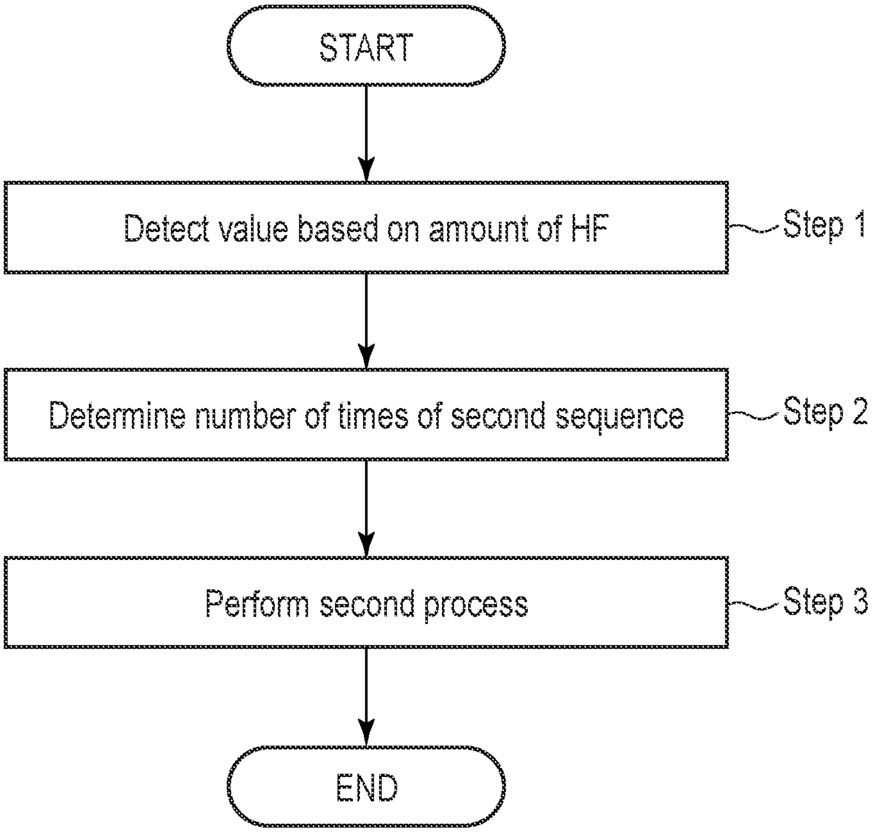
FIG. 18 is a flowchart showing an operation of a specific example of a fourth modified example of the film forming method according to the embodiments.

FIG. 18 is a flowchart showing operations of a specific example of the modified example. In the example shown in FIG. 18, the number of times of the second sequence S2 in the second process P2 is controlled based on the amount of the byproduct (HF) detected by the gas detector 330.

First, a value based on the amount of the byproduct (HF) exhausted in the purge gas supply step is detected by the gas detector 330, and the detected value is sent to the control unit 400 (step 1).

In the control unit 400, the number of times of the second sequence S2 in the second process P2 is determined based on the detection value. For example, the number of times of the second sequence S2 is determined based on temporal changes in the detection value (corresponding to temporal changes in the amount of HF exhausted) (step 2).

Furthermore, the second process P2 is performed at the determined number of times of the second sequence S2 (step 3).

The modified example is also the same as the embodiments in basic control method, and the same advantages as those of the above-described embodiments can be obtained. In addition, in this modified example, the number of times of the second sequence S2, and the like can be optimized and the first process P1 and the second process P2 can be accurately controlled, by the above-described control method.

In the above-described specific example, the number of times of the second sequence S2 in the second process P2 is determined based on the detection result at the gas detector 330, but the number of times of the first sequence S1 in the first process P1 may be determined based on the detection result at the gas detector 330.

In the embodiments and modified examples described above, forming the W layer in the space 512 has been described, but a block insulating layer (such as an AlO layer) and a barrier metal layer (such as a TiN layer) may be formed in this order along the side surfaces of the space 512 and then the W layer may be formed in the space 512 where the block insulating layer and the barrier metal layer are formed. The same control method as the above-described control method can also be applied when a TiN layer is formed as a barrier metal layer. In this case, $TiCl_4$ can be used as the film forming gas (source gas), $NH_3$ can be used as the reduction gas, and $N_2$ can be used as the purge gas.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A film forming method comprising alternately performing a first process including at least two times of a first sequence and a second process including at least one time of a second sequence, wherein the first sequence includes supplying a film forming gas into a film forming chamber in which a film formation object is set, supplying a first purge gas into the film forming chamber in which the film formation object is set, supplying a first reduction gas into the film forming chamber in which the film formation object is set, and supplying a second purge gas into the film forming chamber in which the film formation object is set, in order, and the second sequence includes supplying a second reduction gas into the film forming chamber in which the film formation object is set, and supplying a third purge gas into the film forming chamber in which the film formation object is set, in order, wherein "p" is a positive integer larger than or equal to 1, "a" is a positive integer larger than or equal to 1, and a number of times of the second sequence in (p+a)-th second process is larger than a number of times of the second sequence in p-th second process.

2. The method of claim 1, wherein

"q" is a desired positive integer larger than or equal to 1, "b" is a desired positive integer larger than or equal to 1, and a number of times of the first sequence in (q+b)-th first process is smaller than a number of times of the first sequence in q-th first process.

3. The method of claim 1, wherein the film forming gas is supplied into the film forming chamber through a gas tank, and the film forming gas is not supplied into the gas tank during a period when the second process is performed.

4. The method of claim 1, wherein the first and second processes are controlled based on an amount of a byproduct produced in the film forming chamber.

5. The method of claim 1, wherein the film forming method is a film forming method using atomic layer deposition (ALD).

6. The method of claim 1, wherein number of times of the first sequence included in each of the first processes is smaller than twice number of times of the first sequence required to form one atomic layer on a surface of the film formation object.

7. The method of claim 1, wherein the film forming gas contains a metallic element.

8. The method of claim 1, wherein the first reduction gas and the second reduction gas are the same reduction gas.

9. The method of claim 1, wherein the first purge gas, the second purge gas and the third purge gas are the same purge gas.

10. The method of claim 1, wherein the film formation object has a structure in which a plurality of insulating layers and a plurality of spaces are alternately arranged, and a plurality of conductive layers are formed in the plurality of spaces by alternately performing the first process and the second process.

* * * * *